(12) United States Patent
Chiang

(10) Patent No.: US 7,881,422 B1
(45) Date of Patent: Feb. 1, 2011

(54) CIRCUITS AND METHODS FOR DIVIDING FREQUENCY BY AN ODD VALUE

(75) Inventor: Kevin Chiang, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 42 days.

(21) Appl. No.: 12/490,051

(22) Filed: Jun. 23, 2009

Related U.S. Application Data

(60) Provisional application No. 61/079,621, filed on Jul. 10, 2008.

(51) Int. Cl.
  *H03K 21/00* (2006.01)
(52) U.S. Cl. .......................................... 377/47; 377/48
(58) Field of Classification Search .................. None
  See application file for complete search history.

(56) References Cited

U.S. PATENT DOCUMENTS

| | | | | |
|---|---|---|---|---|
| 5,365,119 A | * | 11/1994 | Kivari | 327/115 |
| 5,371,772 A | * | 12/1994 | Al-Khairi | 377/47 |
| 5,524,035 A | * | 6/1996 | Casal et al. | 377/47 |
| 6,018,258 A | * | 1/2000 | Kang | 327/115 |
| 6,445,760 B1 | * | 9/2002 | Weintraub et al. | 377/48 |
| 6,501,815 B1 | * | 12/2002 | Stansell | 377/47 |
| 7,215,211 B2 | * | 5/2007 | Lipan et al. | 331/34 |
| 7,635,999 B1 | * | 12/2009 | Jamal | 327/117 |

* cited by examiner

*Primary Examiner*—Tuan Lam

(57) ABSTRACT

In one embodiment, the present invention includes a frequency divider circuit for dividing the frequency of an input signal by an odd value. In one embodiment, a frequency divider circuit includes a counter configured to receive a clock input signal and a divisor having an odd value. The counter counts clock cycles up to the divisor to generate a count. A control circuit is configured to receive the count, the divisor, and the clock input signal and generate one or more control signals to control a state of a clock output signal. A half cycle adjust circuit is configured to receive the clock input signal and the one or more control signals from the control circuit and provide an additional one-half cycle adjustment of the clock output signal. The frequency divider circuit may be a feed forward circuit with fast startup characteristics.

20 Claims, 6 Drawing Sheets

CIRCUITS AND METHODS FOR DIVIDING FREQUENCY BY AN ODD VALUE

CROSS REFERENCE TO RELATED APPLICATIONS

This application claims the benefit of priority from U.S. Provisional Application No. 61/079,621, filed Jul. 10, 2008, entitled "Odd Number Clock Divider" the entire disclosure of which is hereby incorporated herein by reference.

BACKGROUND

The present invention relates to frequency divider circuits, and in particular, to circuits and methods for dividing frequency by an odd value.

Clock dividers provide alternate clock sources for digital systems. A clock divider typically receives a main clock having a frequency (f1) from a central oscillator and divides the main clock frequency to produce a lower frequency (f2) based on a divisor (e.g., the number used to divide the clock). The input and output frequencies may be related as follows:

$$f2 = \frac{f1}{N}$$

where N is the divisor and may be an integer, for example.

In a synchronous system, clock signals typically have a 50% duty cycle. Accordingly, dividing a clock signal by an even value, such as N=2, 4, 6, etc. . . . , is a simple task. For example, a simple divide-by-two circuit may use a D flip flop with an output connected to the D input. If the D flip flop is triggered by the rising edge of the clock signal, the output of the D flip flop transitions at one-half the rate of the clock signal. Multiple D flip flops may be cascaded to implement other even valued dividers.

However, odd value dividers are not straightforward to implement. One existing approach to implementing odd value division uses a phase locked loop to provide high quality clock sources at lower frequencies. However, clock dividers based on phase locked loops may require a settling time when powered up or when changing divisors. If an odd value division of a clock signal is required to operate a system (e.g., during startup), such a system may take a much greater time to transition into normal operation due to this settling time.

Thus, it would be desirable to provide improved frequency divider circuits. The present invention solves these and other problems by providing circuits and methods for dividing frequency by an odd value.

SUMMARY

Embodiments of the present invention improve odd value frequency division. In one embodiment, the present invention includes a frequency divider circuit comprising a counter, a control circuit, and a half cycle adjust circuit. The counter is configured to receive a clock input signal and a divisor having an odd value. The counter repetitively counts clock cycles of the clock input signal up to the divisor to generate a count. The control circuit is configured to receive the count, the divisor, and the clock input signal. The control circuit generates one or more control signals to control a state of a clock output signal of the frequency divider circuit. The half cycle adjust circuit is configured to receive the clock input signal and the one or more control signals from the control circuit and provide an additional one-half cycle adjustment of at least one of the control signals to control the clock output signal. The clock output signal transitions to a first state in response to a first transition of at least one of the control signals between the first state and a second state. Additionally, the clock output signal transitions to the second state one-half of a cycle of the clock input signal after a second transition of at least one of the control signals between the first state and the second state.

In one embodiment, the control circuit generates one control signal, and the control signal is in the first state when the count is greater than or equal to one-half the divisor and the control signal is in the second state when the count is less than one-half the divisor.

In one embodiment, the first transition of the control signal is in response to the count having a value that is equal to one-half the divisor, and the second transition of the control signal is in response to the count having a value that is greater than one-half the divisor.

In one embodiment, the control circuit compares the count to one-half the divisor to generate the control signal.

In one embodiment, the half cycle adjust circuit increases the period of the control signal by one-half cycle.

In one embodiment, the half cycle adjust circuit comprises a flip flop and an OR gate. The flip flop is configured to receive the control signal and an inverted clock input signal, and the OR gate is configured to receive the control signal and an output of the flip flop.

In one embodiment, the control circuit generates first and second control signals, where the first control signal controls the transition of the clock output signal to the first state, and where the second control signal controls the transition of the clock output signal to the second state.

In one embodiment, the half cycle adjust circuit adjusts the second control signal by one-half cycle of the clock input signal.

In one embodiment, the first transition is a transition of the first control signal to the first state for one cycle of the clock input signal when the count is equal to the divisor minus one, and the second transition is a transition of the second control signal to the first state for one cycle of the clock input signal when the count is equal to one-half the divisor.

In one embodiment, the half cycle adjust circuit comprises a first flip flop configured to receive the second control signal and an inverted clock input signal and a second flip flop configured to receive the first control signal, the clock input signal, and an output of the first flip flop, where the second flip flop provides the clock output signal.

In one embodiment, a signal path from the clock input signal to the clock output signal through the counter, the control circuit, and the half cycle adjust circuit is feed forward signal path.

In another embodiment, the present invention includes a method of dividing a frequency of a clock signal comprising receiving a clock input signal, receiving a divisor, repetitively counting clock cycles of the clock input signal up to the divisor to generate a count, generating one or more control signals to control a state of a clock output signal based on the clock input signal, the divisor, and the count, and adjusting at least one of the control signals by one-half cycle of the clock input signal to control the clock output signal. The clock output signal transitions to a first state in response to a first transition of at least one of the control signals between the first state and a second state. Additionally, the clock output signal transitions to the second state one-half of a cycle of the clock input signal after a second transition of at least one of the control signals between the first state and the second state.

In one embodiment, generating one or more control signals comprises generating one control signal, where the control signal is in the first state when the count is greater than or equal to one-half the divisor and the control signal is in the second state when the count is less than one-half the divisor.

In one embodiment, the first transition of the control signal is in response to the count having a value that is equal to one-half the divisor, and the second transition of the control signal is in response to the count having a value that is greater than one-half the divisor.

In one embodiment, generating one or more control signals further comprises comparing the count to one-half the divisor to generate the control signal.

In one embodiment, adjusting at least one of the control signals comprises increasing the period of the control signal by one-half cycle.

In one embodiment, adjusting at least one of the control signals comprises storing the first state of the control signal in a flip flop in response to an inverted clock input signal and performing a logical OR operation on the control signal and an output of the flip flop.

In one embodiment, generating one or more control signals comprises generating first and second control signals, where the first control signal controls the transition of the clock output signal to the first state, and where the second control signal controls the transition of the clock output signal to the second state.

In one embodiment, adjusting at least one of the control signals comprises adjusting the second control signal by one-half cycle of the clock input signal.

In one embodiment, the first transition is a transition of the first control signal to the first state for one cycle of the clock input signal when the count is equal to the divisor minus one, and the second transition is a transition of the second control signal to the first state for one cycle of the clock input signal when the count is equal to one-half the divisor.

The following detailed description and accompanying drawings provide a better understanding of the nature and advantages of the present invention.

DETAILED DESCRIPTION

Described herein are circuits and methods for dividing a frequency by an odd value. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
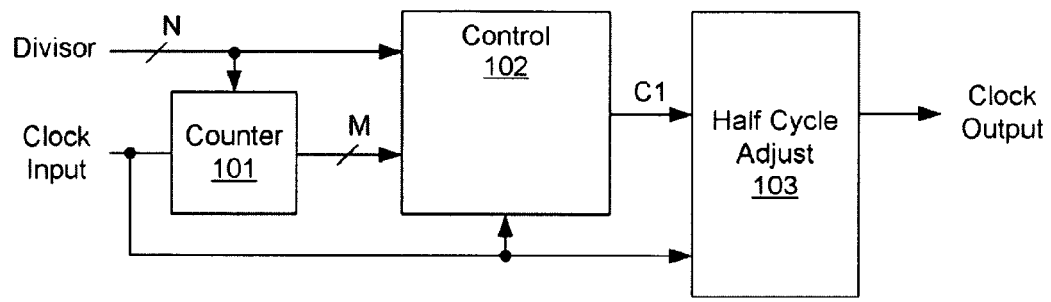
FIG. 1 illustrates a frequency divider circuit according to one embodiment of the present invention.

FIG. 1 illustrates a frequency divider circuit 100 according to one embodiment of the present invention. Frequency divider circuit 100 includes counter 101, control circuit 102, and half cycle adjust circuit 103. Counter 101 is configured to receive a clock input signal and a divisor. The divisor may be an N-bit digital signal, for example, and may have an odd value. Frequency divider circuit 100 divides the clock input signal by the odd value specified by the divisor as described below to produce a clock output signal. Counter 101 repetitively counts clock cycles (e.g., 1 full period) of the clock input signal up to the divisor to generate a count. The count may be an M-bit digital signal, for example. Counter 101 may receive the clock input signal and increment the value of the count each clock cycle and reset the count when the count value is greater than or equal to the divisor.

Control circuit 102 is configured to receive the count, the divisor, and the clock input signal. Embodiments of control circuit 102 may generate one or more control signals, C1, to control a state of the clock output signal. Accordingly, control signal C1 may be one control signal or multiple control signals. The one or more control signals generated by control circuit 102 may be used to control when the clock output signal transitions between states so that odd value division of the clock input signal may be achieved. Half cycle adjust circuit 103 is configured to receive the clock input signal and the one or more control signals, C1 from control circuit 102. Half cycle adjust circuit 103 provides an additional one-half cycle adjustment of the clock output signal as illustrated in more detail below to achieve odd value division of the clock input signal.

Embodiments of the present invention may use the count generated by counter 101 to control transitions of the clock output signal. Odd value division may be achieved by adjusting the clock output signal by one-half of a cycle of the clock input signal using half cycle adjust circuit 103. For instance, the clock output signal may transition to a first state in response to a first transition of at least one of the control signals between the first state and a second state. The clock output signal may transition to a second state one-half of a cycle of the clock input signal after a second transition of at least one of the control signals between the first state and the second state. The first state may be a logic high represented as a high voltage such as 3.3 v, and the second state may be a logic low represented as a low voltage such as 0 v, for example. The first and second transitions may be transitions of one control signal or more than one control signal in response to one or more count values, for example. Advantageously, embodiments of the present invention may be implemented using feed forward digital logic circuits (e.g., the counter, control circuit, and half cycle adjust circuit). For instance, a signal path from the clock input signal to the clock output signal through the counter, the control circuit, and the half cycle adjust circuit may be exclusively a feed forward signal path with no feedback loops. Additionally, the digital logic circuits may also be synchronous, for example. Accordingly, since there is no feedback in such embodiments, the time to generate the divided output signal is faster and may be synchronized with the clock input signal.

Figure 2:
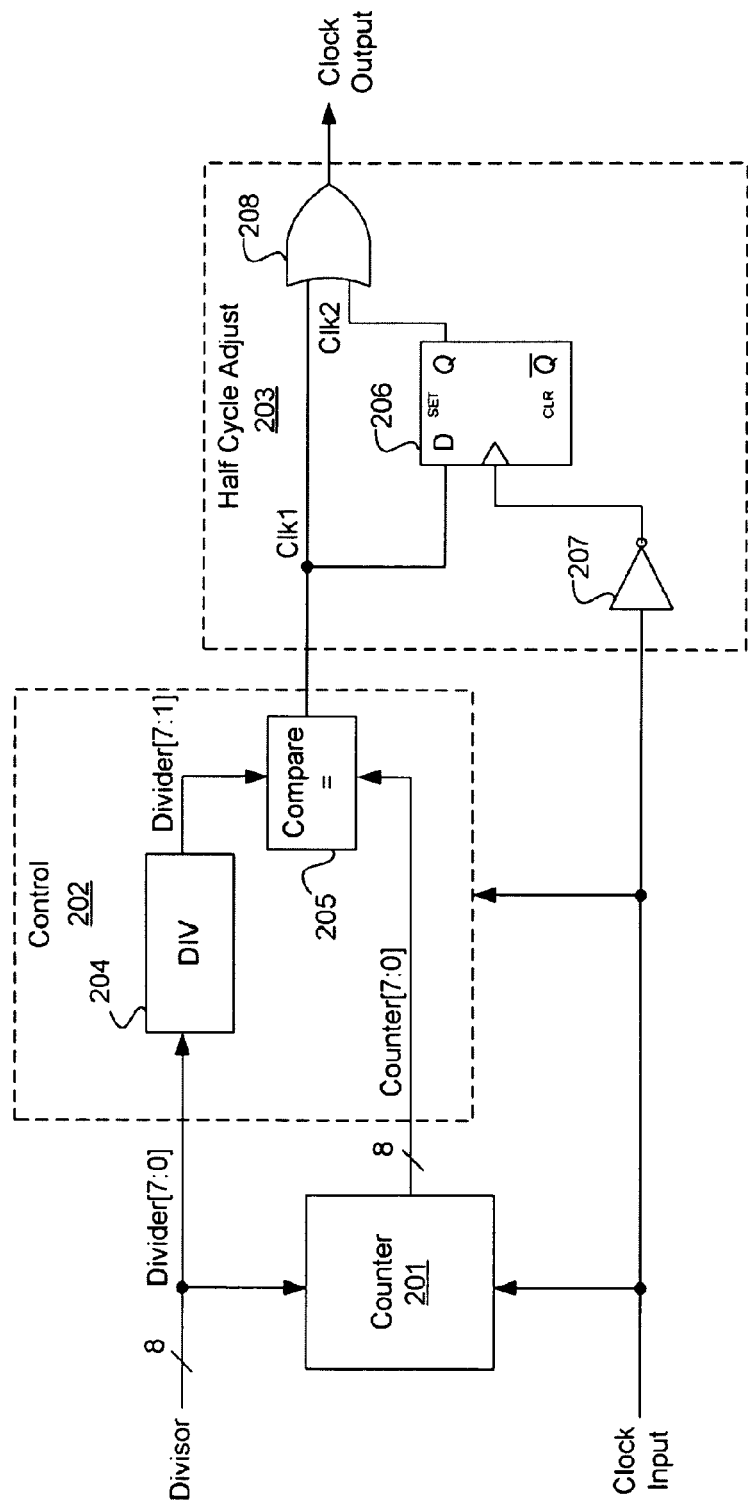
FIG. 2 illustrates an example frequency divider circuit according to another embodiment of the present invention.

FIG. 2 illustrates an example frequency divider circuit 200 according to another embodiment of the present invention. Frequency divider circuit 200 illustrates an example counter 201, control circuit 202, and half cycle adjust circuit 203. Counter 201 may be powered up with a random count value, for example. When counter 201 powers up, the random count is compared to the divisor. If the count is greater than or equal to the divisor, then counter 201 resets the count. If the count is less than the divisor, then counter 201 begins counting each cycle of the clock input signal. This feature may be advantageous for startup applications to ensure that frequency divider circuit 100 initializes quickly into a working state. In this embodiment, the divisor is an 8-bit word Divider[7:0] and the counter output signal (or count) is an 8-bit word Counter[7:0].

In this example, control circuit 202 generates one control signal, Clk1, to control the state of the clock output signal. As described in more detail below, control signal Clk1 is equal to the clock input signal digitally divided by one-half of the odd divisor value. In the example below, the divisor value is 3 (i.e., divide by 3). Accordingly, control signal Clk1 is one clock cycle (i.e., 3 DIV 2=1 using digital logic). As illustrated below, the rising edge of the control signal Clk1 is used to transition the clock output signal into a logic high state, and the falling edge of the control signal Clk1 is adjusted by one-half cycle of the clock input signal to transition the clock output signal into a logic low state, resulting in a clock output signal that is one-third (⅓) the frequency of the clock input signal.

Specifically, control circuit 202 is coupled to receive the divisor (Divider[7:0]), the count (Counter[1:0]), and the clock input signal. In this example, control circuit 202 may generate a second divisor, Divider[7:1], by performing a divide operation ("DIV") 204 on Divider[7:0]. For example, in a binary system, the divisor may be divided by 2 by shifting Divider[7:0] to the right as follows:

Divider[7:0]=00000011

Divider[17:1]=0000001=Divider[7:0] DIV 2.

Control circuit 202 may perform a compare operation 205 on the count and Divider[7:1] to produce control signal Clk1. The compare operation 205 compares Counter[7:0] to Divider[7:1] on each cycle of the clock input signal to determine if Counter[7:0] is equal to Divider[7:1]. In this example, Counter[7:0] repetitively counts from zero to three (divisor=3) and resets back to zero. However, each time Counter[7:0] has a value that is equal to Divider[7:1] (e.g., divisor DIV 2=1) control signal Clk1 transitions from one logic state (e.g., logic low) to another logic state (e.g., logic high) as a result of compare operation 205. On the next clock cycle, Counter[7:0] increments to the next value (e.g., 2), and control signal Clk1 transitions back the other logic state (e.g., logic low) because the count has a value that is greater than one-half the divisor value (e.g., greater than 1). Therefore, in this example, where the divisor is equal to 3, the control signal Clk1 is a pulse having a duration of one period of the clock input signal. The pulse repeats once every 3 cycles of the clock input signal. Timing and logic diagrams for this example circuit are shown in FIG. 3 and described below.

The half cycle adjust circuit 203 may be coupled to receive the clock input signal and the control signal Clk1. In this example, the half cycle adjust circuit 203 includes a flip flop 206 (e.g., a D flip flop), an inverter 207, and an OR gate 208. Control signal Clk1 is coupled to one input of OR gate 208. One input of the flip flop 206 is coupled to receive the control signal Clk1, and a clock input of flip flop 206 is coupled to receive the clock input signal through inverter 207 so that the flip flop 206 receives an inverted clock input signal and triggers on the falling edge of the clock input signal. An output of the flip flop 206 is coupled to a second input of the OR gate 208 (signal line "Clk2"). The half cycle adjust circuit 203 adds one-half of a cycle of the clock input signal to control signal Clk1 to achieve odd division. Continuing the example above where the divisor is 3, the compare operation 205 generates a control signal Clk1 that transitions from logic low to logic high for one full period of the clock input signal and repeats every three cycles. OR gate 208 receives the control signal Clk1 and generates the clock output signal. Accordingly, assuming the output of the flip flop 206 is initially logic low, the clock output signal transitions to from logic low to logic high when control signal Clk1 transitions from logic low to logic high (e.g., when Counter[7:0] is equal to Divider[7:1]). In order for the clock output signal frequency to be one-third (⅓) of the clock input signal frequency at 50% duty cycle, an additional one-half (½) cycle is added. In this example, the one-half cycle adjustment is accomplished by storing the logic high state of the control signal Clk1 in flip flop 206 in response to the inverted clock input signal. Accordingly, after control signal Clk1 transitions to a logic high state, it is stored in flip flop 206 on the next falling edge of the clock input signal, having been inverted by inverter 207. Therefore, since the output of the flip flop 206 (signal line Clk2) is in a logic high state on the next half-cycle of the clock input signal after control signal Clk1 goes low, the output of OR gate 208 (the clock output signal) remains high for an additional one-half of a cycle of the clock input signal. On the next falling edge of the clock input signal, the flip flop 206 stores the logic low state of control signal Clk1. Accordingly, both inputs of the OR gate are logic low, and the clock output signal transitions to logic low one-half of a cycle of the clock input signal after control signal Clk1 transitions to logic low.

Figure 3:
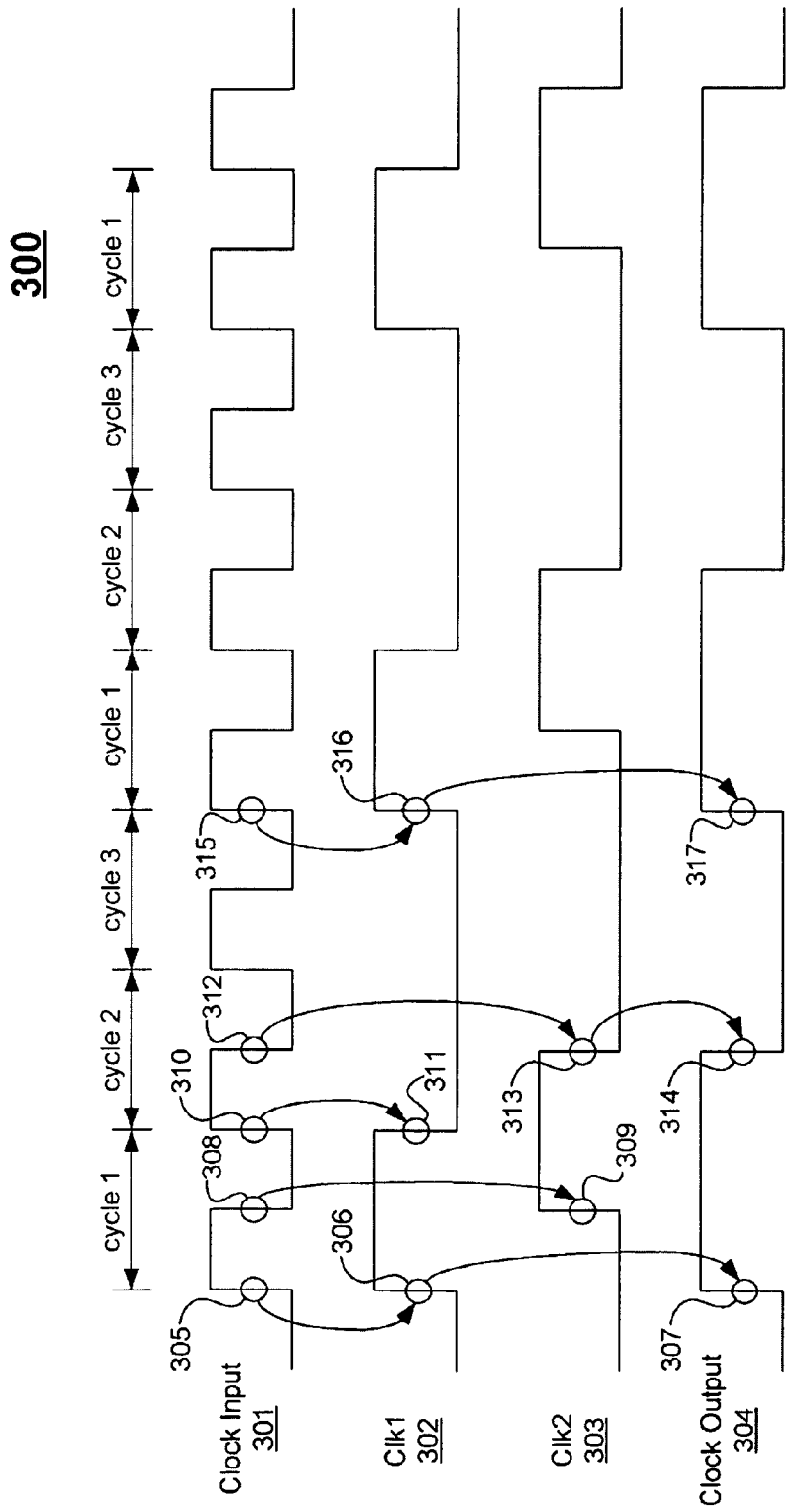
FIG. 3 illustrates a timing diagram associated with the frequency divider circuit of FIG. 2.

FIG. 3 illustrates a timing diagram 300 associated with the frequency divider circuit 200 of FIG. 2. Timing diagram 300 includes a clock input waveform 301, a Clk1 waveform 302, a Clk2 waveform 303, and a clock output waveform 304. In this example, a cycle begins at point 305 on the rising edge of clock input waveform 301. Clk1 waveform 302 changes state at point 306 in response to the clock input waveform 301 changing state at point 305, which is when the count value of 1 is equal to one-half the divisor value as described above. Clock output waveform 304 changes state at point 307 in response to Clk1 waveform 302 changing state at point 306. Clk2 waveform 303 changes state at point 309 in response to Clk1 waveform 302 being in a high state on the falling edge of clock input waveform 301 at point 308.

As mentioned above, Clk1 waveform 302 changes state at point 311 in response to clock input waveform 301 changing state at point 310 (e.g., after 1 cycle of the clock input signal), where counter 201 increments to a value above one-half the divisor value. Clk2 waveform 303 changes state at point 313 in response to the falling edge of clock input waveform 301 at point 312. Clock output waveform 304 changes state at point 314 in response to Clk2 waveform 303 changing state at point 313. The half cycle between point 311 and point 313 adds a half cycle to clock output waveform 304 such that the frequency of the clock output signal is one-third (⅓) the frequency of the clock input signal and the clock output signal has a 50% duty cycle. The process repeats at points 315, 316, and 317 for the next cycle.

Figure 4:
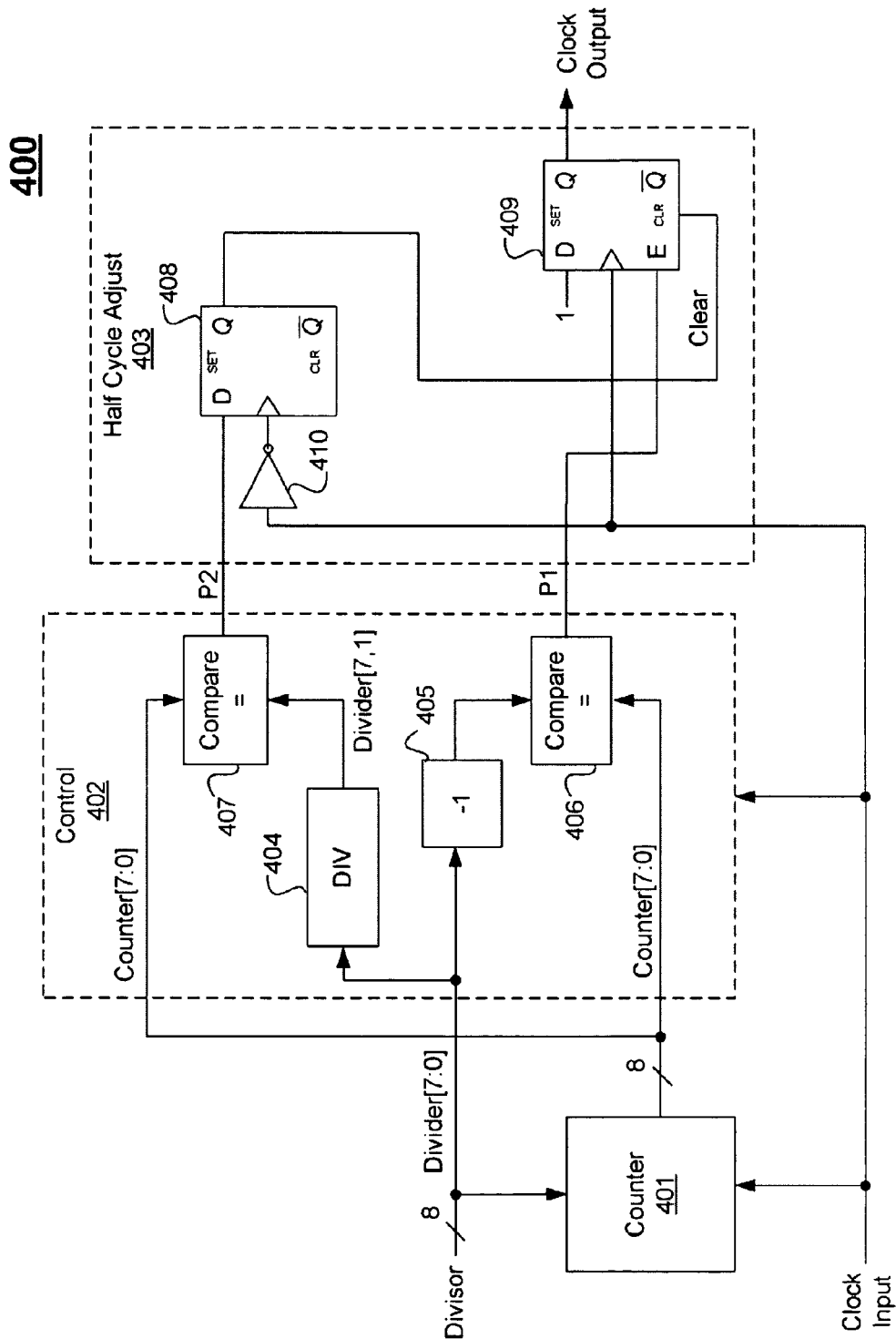
FIG. 4 illustrates an example frequency divider circuit according to another embodiment of the present invention.

FIG. 4 illustrates an example frequency divider circuit according to another embodiment of the present invention. Frequency divider circuit 400 includes a counter 401, a control circuit 402, and a half cycle adjust circuit 403. In this example, counter 401 receives an 8-bit divisor and the clock input signal, and generates an 8-bit count (Counter[7:0]) in substantially the same manner as counter 201 of FIG. 2. Control circuit 402 implements a divide operation ("DIV") 404, a subtraction operation 405, and two compare operations 406-407, for example. In this example, control circuit 402 generates two control signals P1 and P2. One control signal (e.g., P1) controls the transition of the clock output signal to the logic high state, and the other control signal (e.g., P2) controls the transition of the clock output signal to the logic low state. Additionally, in this example implementation, one control signal (e.g., P1) transitions to the logic high state for one cycle of the clock input signal when the count is equal to the divisor minus one, and the other control signal (e.g., P2) transitions to the logic high state for one cycle of the clock input signal when the count is equal to one-half the divisor. The half cycle adjust circuit 403 adjusts control signal P2 by one-half cycle of the input clock signal to achieve an odd value frequency division, for example.

More specifically, control signal P2 is generated by comparing the count to a divided version of the divisor similar to control signal Clk1 of FIG. 2. For instance, Counter[7:0] is compared to Divider[7:1] (one-half the divisor), and control signal P2 transitions to a logic high if the values are equal and outputs a logic low if the values are not equal. In this example, the divisor is 5, so the count increases to 2 (5 DIV 2=2) and triggers the transition of control signal P2 from logic low to logic high. When the count increases to 3, P2 transitions back to logic low. Therefore, in this example, the control signal P2 is a pulse having a duration of one period of the clock input signal. The pulse for control signal P2 repeats once every 5 cycles of the clock input signal.

Control signal P1 is generated by comparing the count to the divisor minus one. The subtract operation 405 may be used to generate the divisor minus one value (e.g., Divider[7:0]−1). Compare operation 406 may compare Counter[7:0] to the result from the subtract operation 405 to provide signal P1. In this example, compare operation 406 generates a logic high when the inputs are equal. Therefore, the count increases up to 4 (e.g. Divider[7:0]−1=4, where the divisor is 5), at which point control signal P1 transitions from logic low to logic high. On the next clock cycle, P1 transitions to logic low. Accordingly, P1 is a pulse having a duration of one period of the clock input signal when the count is equal to the divisor minus one. The pulse for control signal P1 repeats once every 5 cycles of the clock input signal.

Half cycle adjust circuit 403 includes flip flop 408, flip flop 409, and inverter 410. An input of flip flop 408 is coupled to receive control signal P2 from control circuit 402 and a clock input is coupled to receive an inverted clock input signal from inverter 410. An output of flip flop 408 is coupled to the clear ("CLR") input of flip flop 409 to provide a "Clear" signal, which resets flip flop 409 to a logic low state, for example. Flip flop 409 includes an enable input ("E") that is coupled to receive signal P1 from control circuit 402. Additionally, a clock input of flip flop 409 is coupled to receive the clock input signal. An input of flip flop 409 is coupled to a logic high state, such as a voltage representing logic high, for example. An output of flip flop 409 provides the clock output signal. In this example, flip flops 408 and 409 are D flip flops.

Figure 5:
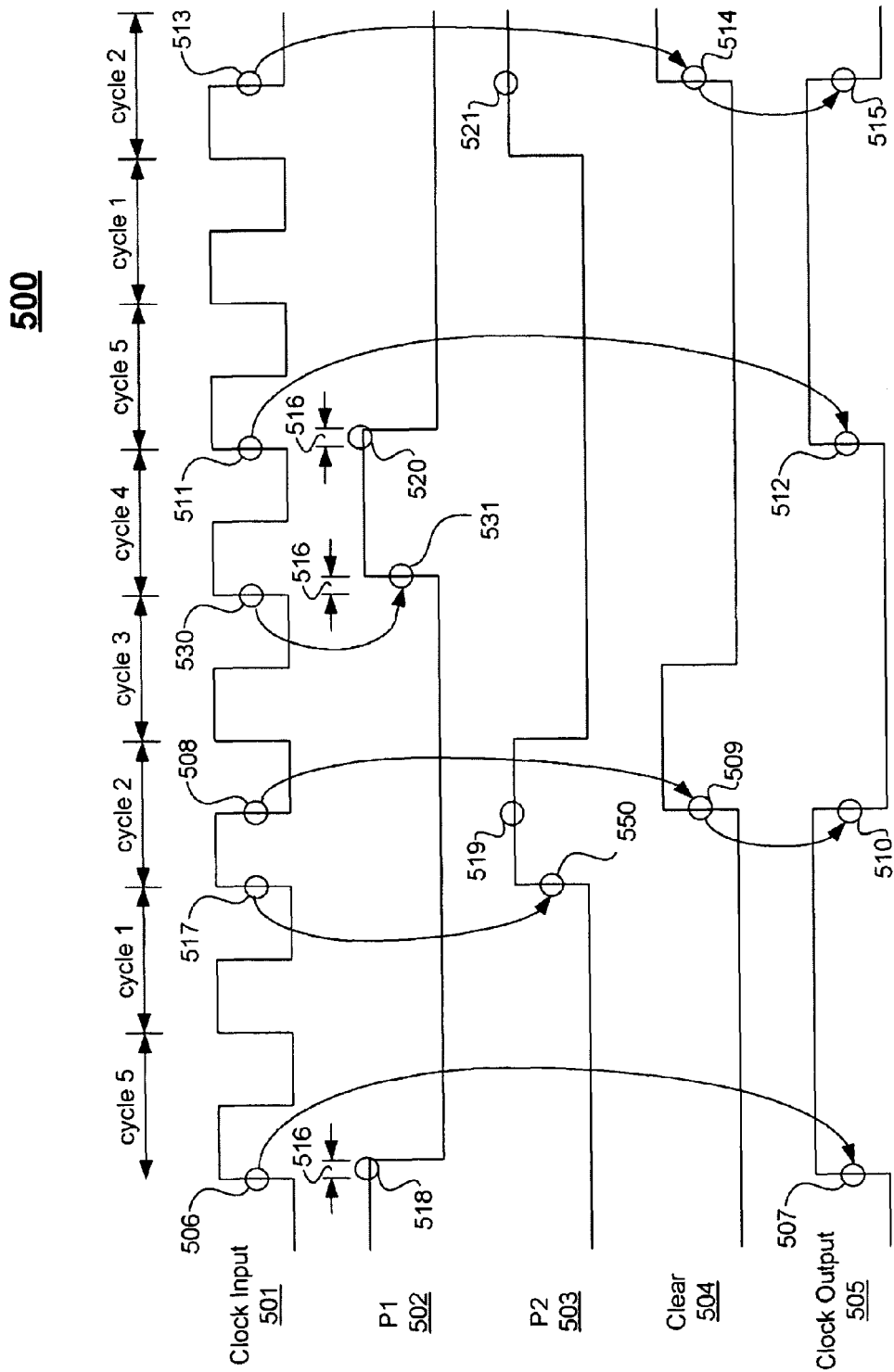
FIG. 5 illustrates a timing diagram associated with the frequency divider circuit of FIG. 4.

FIG. 5 illustrates a timing diagram 500 illustrating the operation of frequency divider circuit 400 of FIG. 4. Timing diagram 500 includes a clock input waveform 501. P1 waveform 502, P2 waveform 503. Clear waveform 504, and a clock output waveform 505. Operation of circuit 400 may be understood by first referring to control signal P2 and then control signal P1. From the description above with regard to FIGS. 2 and 3, it is understood that control signal P2, which is similar to Clk1, transitions from logic low to logic high when the count is equal to one-half the divisor (e.g. 5 DIV 2=2). Accordingly, when the count increases to a value of 2, control signal P2 transitions to logic high for one cycle. This is illustrated at point 517 of clock input waveform 501 and point 550 of P2 waveform 503. Control signal P2 is stored in flip flop 408 on the falling edge of the clock input signal because flip flop 408 is clocked by the inverted clock input signal. This is illustrated at point 519 of P2 waveform 503. Accordingly, the output of flip flop 408 (the "Clear" signal) transitions to logic high one-half cycle after count is equal to one-half the divisor as illustrated at point 509 in Clear waveform 504. The Clear signal, in turn, resets flip flop 409. Assuming the output of flip flop 409, which is the clock output signal, is initially at logic high, the transition of control signal P2 results in a transition of the clock output signal from logic high to logic low one-half cycle of the clock input signal later as illustrated at point 510, in clock output waveform 505.

Referring now to control signal P1, as the count continues to increase, compare operation 406 results in a transition of control signal P1 from a logic low state to a logic high state when the value of Counter[7:0] is equal to 4 (divisor minus 1). This is illustrated at point 530 in clock input waveform 501 and point 531 in P1 waveform 502. In this example, control signal P1 enables flip flop 409. Accordingly, flip flop 409 stores a logic high on the next rising edge 511 of the clock input signal, which results in a transition of the clock output signal to logic high as illustrated at point 512 in clock output waveform 512. Additionally, control signal P1 is reset to logic low on rising edge 511 of the clock input signal. However, control signal P1 is in a logic high state when rising edge 511 is received by flip flop 409, and a delay 516 between the rising edge of the clock and the output of comparison operation 406 allows flip flop 409 to capture the logic high value at its input before control signal P1 is reset. Waveform 505 illustrates that the frequency of the clock output signal is one-fifth (⅕) the frequency of the clock input signal. Points 513, 514, 515, and 521 illustrate the effect of control signal P2 for the next count cycle, where the clock output signal transitions from logic high to logic low, and points 506, 518, and 507 illustrate the effect of control signal P1 for the previous count cycle, where the clock output signal transitions from logic low to logic high.

Figure 6:
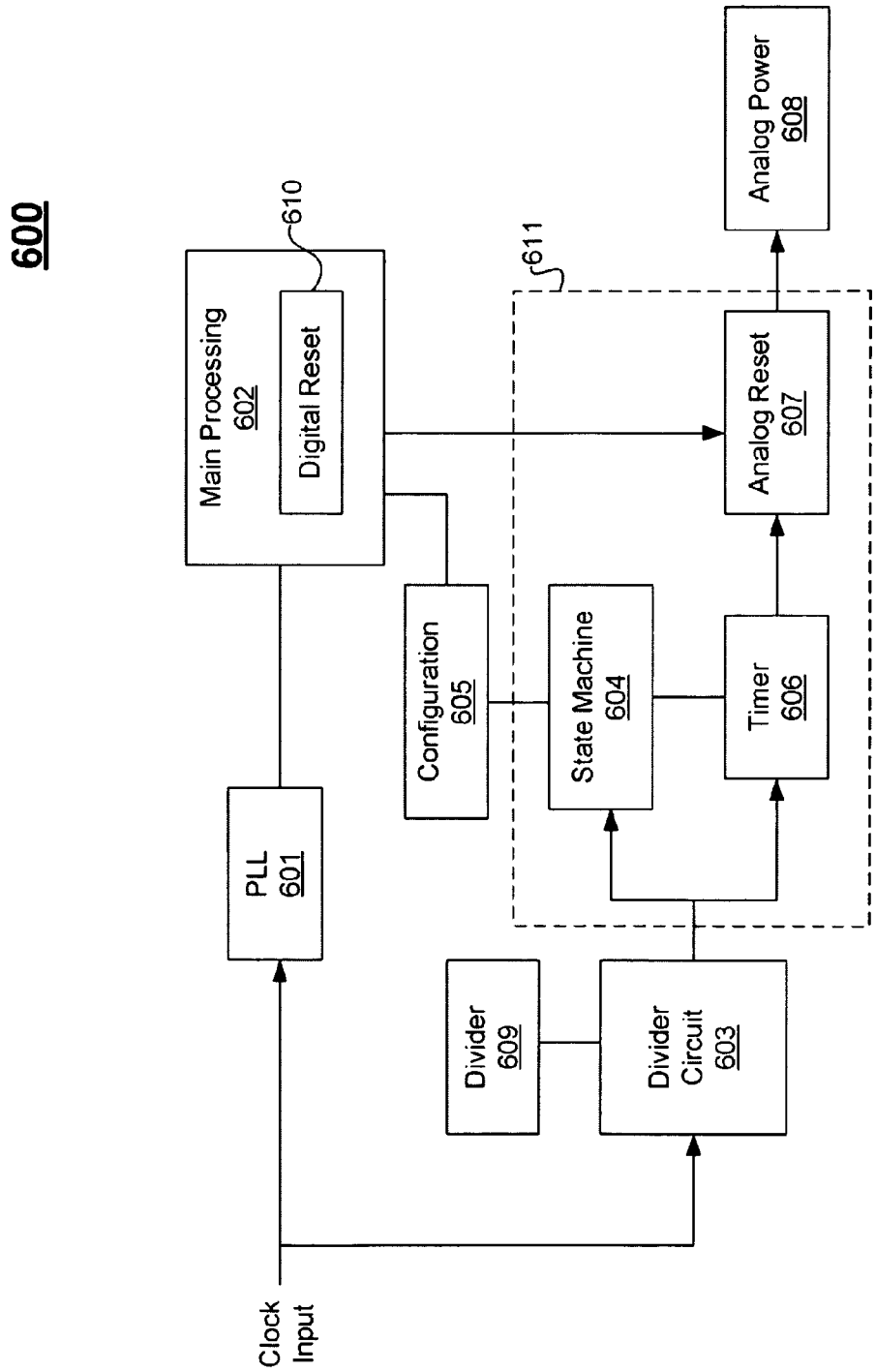
FIG. 6 illustrates a system utilizing frequency dividing according to another embodiment of the present invention.

FIG. 6 illustrates a system 600 utilizing frequency dividing according to another embodiment of the present invention. System 600 includes PLL 601, microprocessor 602, divider circuit 603, state machine 604, configuration circuit 605, timer circuit 606, analog reset circuit 607, and analog power supply 608. Microprocessor 602 is the main processor for system 600 during normal operation. Microprocessor 602 may have an implemented operation for generating a digital reset 610 for any peripheral circuits (not shown) which may be included in system 600. A startup circuit 611 may include state machine 604, timer circuit 606, and analog reset circuit 607. Startup circuit 611 provides a startup routine which may configure system 600 and provide timing prior to the settling time for PLL 601 and/or the time required for microprocessor 602 to reset and control system 600 in a normal mode. The startup routine may be part of power up sequence when power is initially supplied to system 600.

At startup, a clock input is provided to PLL 601 and to divider circuit 603. PLL 601 may have a settling time before an output of PLL 601 settles to the desired frequency. Divider circuit 603 may be implemented using the techniques described above, for example, and may include a counter, control circuit, a half cycle adjust circuit, and one or more control signals according to various embodiments of the present invention. Accordingly, and in contrast to the PLL, divider circuit 603 begins generating a clock output signal almost immediately. Divider circuit 603 may use divider 609 to set the divisor as described above in previous embodiments. Divider circuit 603 generates a clock output signal having a frequency which corresponds to the clock input signal divided by the divider 609. The clock output signal may have a 50% duty cycle.

Divider circuit 603 is coupled to provide the clock output signal to state machine 604 and timer circuit 606. State machine 604 may control the startup function. State machine 604 may be coupled to retrieve configuration data from configuration circuit 605. State machine 604 may prepare hardware with a portion of the configuration data or prepare the data for microprocessor 602 in preparation for normal operation. State machine 604 may also be coupled to timer circuit 606 which may be controlled to provide timing related to the startup process. This may include delays associated with the analog reset circuit 607 and powering up analog peripherals (not shown) with analog power supply 608. For example, microprocessor 602 may generate digital reset 610, and analog reset circuit 607 may generate an analog reset which incorporates a delay from timer circuit 606. Startup circuit 611, together with divider circuit 603 implemented according to an embodiment of the present invention may be able to save time during startup of system 600.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A frequency divider circuit comprising:
   a counter configured to receive a clock input signal and a divisor, the divisor having an odd value, the counter repetitively counting clock cycles of the clock input signal up to the divisor to generate a count;
   a control circuit configured to receive the count, the divisor, and the clock input signal, the control circuit generating one or more control signals to control a state of a clock output signal of the frequency divider circuit; and
   a half cycle adjust circuit configured to receive the clock input signal and the one or more control signals from the control circuit and provide an additional one-half cycle adjustment of at least one of the control signals to control the clock output signal,
   wherein the clock output signal transitions to a first state in response to a first transition of at least one of the control signals between the first state and a second state, and
   wherein the clock output signal transitions to the second state one-half of a cycle of the clock input signal after a second transition of at least one of the control signals between the first state and the second state.

2. The frequency divider circuit of claim 1 wherein the control circuit generates one control signal, and wherein the control signal is in the first state when the count is greater than or equal to one-half the divisor and the control signal is in the second state when the count is less than one-half the divisor.

3. The frequency divider circuit of claim 2 wherein the first transition of the control signal is in response to the count having a value that is equal to one-half the divisor, and wherein the second transition of the control signal is in response to the count having a value that is greater than one-half the divisor.

4. The frequency divider circuit of claim 2 wherein the control circuit compares the count to one-half the divisor to generate the control signal.

5. The frequency divider circuit of claim 2 wherein the half cycle adjust circuit increases the period of the control signal by one-half cycle.

6. The frequency divider circuit of claim 2 wherein the half cycle adjust circuit comprises:
   a flip flop configured to receive the control signal and an inverted clock input signal; and
   an OR gate configured to receive the control signal and an output of the flip flop.

7. The frequency divider circuit of claim 1 wherein the control circuit generates first and second control signals, wherein the first control signal controls the transition of the clock output signal to the first state, and wherein the second control signal controls the transition of the clock output signal to the second state.

8. The frequency divider circuit of claim 7 wherein the half cycle adjust circuit adjusts the second control signal by one-half cycle of the clock input signal.

9. The frequency divider circuit of claim 7 wherein the first transition is a transition of the first control signal to the first state for one cycle of the clock input signal when the count is equal to the divisor minus one, and wherein the second transition is a transition of the second control signal to the first state for one cycle of the clock input signal when the count is equal to one-half the divisor.

10. The frequency divider circuit of claim 7 wherein the half cycle adjust circuit comprises:
    a first flip flop configured to receive the second control signal and an inverted clock input signal; and
    a second flip flop configured to receive the first control signal, the clock input signal, and an output of the first flip flop,
    wherein the second flip flop provides the clock output signal.

11. The frequency divider circuit of claim 1 wherein a signal path from the clock input signal to the clock output signal through the counter, the control circuit, and the half cycle adjust circuit is feed forward signal path.

12. A method of dividing a frequency of a clock signal comprising:
    receiving a clock input signal;
    receiving a divisor;
    repetitively counting clock cycles of the clock input signal up to the divisor to generate a count;
    generating one or more control signals to control a state of a clock output signal based on the clock input signal, the divisor, and the count; and
    adjusting at least one of the control signals by one-half cycle of the clock input signal to control the clock output signal,
    wherein the clock output signal transitions to a first state in response to a first transition of at least one of the control signals between the first state and a second state, and
    wherein the clock output signal transitions to the second state one-half of a cycle of the clock input signal after a second transition of at least one of the control signals between the first state and the second state.

13. The method of claim 12 wherein generating one or more control signals comprises generating one control signal, and wherein the control signal is in the first state when the count is greater than or equal to one-half the divisor and the control signal is in the second state when the count is less than one-half the divisor.

14. The method of claim 13 wherein the first transition of the control signal is in response to the count having a value that is equal to one-half the divisor, and wherein the second transition of the control signal is in response to the count having a value that is greater than one-half the divisor.

15. The method of claim 13 wherein generating one or more control signals further comprises comparing the count to one-half the divisor to generate the control signal.

16. The method of claim 13 wherein adjusting at least one of the control signals comprises increasing the period of the control signal by one-half cycle.

17. The method of claim 13 wherein adjusting at least one of the control signals comprises:
- storing the first state of the control signal in a flip flop in response to an inverted clock input signal: and
- performing a logical OR operation on the control signal and an output of the flip flop.

18. The method of claim 12 wherein generating one or more control signals comprises generating first and second control signals, and wherein the first control signal controls the transition of the clock output signal to the first state, and wherein the second control signal controls the transition of the clock output signal to the second state.

19. The method of claim 18 wherein adjusting at least one of the control signals comprises adjusting the second control signal by one-half cycle of the clock input signal.

20. The method of claim 18 wherein the first transition is a transition of the first control signal to the first state for one cycle of the clock input signal when the count is equal to the divisor minus one, and wherein the second transition is a transition of the second control signal to the first state for one cycle of the clock input signal when the count is equal to one-half the divisor.

* * * * *